(12) United States Patent
Nakamura et al.

(10) Patent No.: US 8,381,963 B2
(45) Date of Patent: Feb. 26, 2013

(54) COMPRESSION-BONDING APPARATUS

(75) Inventors: Kimio Nakamura, Kawasaki (JP); Yoshiyuki Satoh, Kawasaki (JP); Kenji Kobae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/818,554

(22) Filed: Jun. 18, 2010

(65) Prior Publication Data

US 2010/0327043 A1  Dec. 30, 2010

(30) Foreign Application Priority Data

Jun. 24, 2009  (JP) .................................. 2009-149843

(51) Int. Cl.
*B23K 37/04* (2006.01)
*B29C 65/02* (2006.01)

(52) U.S. Cl. .... 228/44.3; 228/5.5; 228/44.7; 228/235.1; 228/256; 156/358; 156/580

(58) Field of Classification Search ................. 228/44.3, 228/256, 5.5, 44.7, 235.1; 156/580, 358
See application file for complete search history.

(56) References Cited

U.S. PATENT DOCUMENTS

| 3,608,809 | A | * | 9/1971 | Cushman | 228/5.5 |
| 3,729,810 | A | * | 5/1973 | Piechocki | 228/180.21 |
| 7,556,190 | B2 | * | 7/2009 | Matsumura et al. | 228/180.21 |
| 7,703,657 | B2 | * | 4/2010 | Matsumura et al. | 228/5.5 |
| 7,736,459 | B2 | * | 6/2010 | Matsumura | 156/289 |
| 2007/0181633 | A1 | * | 8/2007 | Erlach | 228/5.5 |
| 2009/0261149 | A1 | * | 10/2009 | Furuta et al. | 228/256 |

FOREIGN PATENT DOCUMENTS

| JP | 2002-110744 A1 | 4/2002 |
| JP | 2002-324821 A1 | 11/2002 |
| JP | 2004-119594 A1 | 4/2004 |
| JP | 2004119594 A | * 4/2004 |

* cited by examiner

*Primary Examiner* — Devang R Patel
(74) *Attorney, Agent, or Firm* — Kratz, Quintos & Hanson, LLP

(57) ABSTRACT

A compression-bonding apparatus includes a support stage and a pressing tool. The pressing tool includes a pressing stage, an elastic member and a plurality of bonding heads. The elastic member is held by the pressing stage. The plurality of bonding heads includes an upper surface attached to the elastic member and a lower surface facing an upper surface of the support stage.

10 Claims, 15 Drawing Sheets

COMPRESSION-BONDING APPARATUS

CROSS-REFERENCE TO RELATED APPLICATION

This application is based upon and claims the benefit of priority of Japanese Patent Application No. 2009-149843, filed on Jun. 24, 2009, the entire contents of which are incorporated herein by reference.

FIELD

The embodiments discussed herein relate to a compression-bonding apparatus, for example, for mounting an integrated circuit chip to a package substrate.

BACKGROUND

A large scale integration (LSI) chip is bonded on a surface of a package substrate or a circuit board by, for example, so-called the flip chip technology. The flip chip technology may be referred to as Controlled Collapse Chip Connection (C4) when solder bumps are used. Typically, the flip chip technology refers to a method for interconnecting semiconductor devices, such as IC chips, to external circuitry (e.g., the package substrate) with conductive bumps that have been deposited onto the chip pads. In performing the flip-chip bonding, an underfill material that includes resin is typically applied onto the surface of the package substrate. Then, the conductive bumps deposited on the LSI chip are aligned on corresponding contact pads provided on the surface of the package substrate. A plurality of LSI chips may also be simultaneously provided on a bulk circuit board (see, for example, Japanese Laid-Open Patent Applications 2002-324821, 2002-110744 and 2004-119594). Then, the underfill material is heated and cured. The mounting process of the LSI chip is completed by curing the underfill material. Thereafter, in the case where a plurality of LSI chips are provided on the bulk circuit board, the bulk circuit board is cut into separate package substrates according to the desired size of the LSI chip packages.

JP-A-2002-324821, for example, discloses the lower ends of bonding heads being pressed against an upper surface of respective LSI chips. During the manufacturing process, the respective bonding heads, such as T-shaped heads, are held or housed in a platform structure, and vertically moved with the platform with respect to the corresponding LSI chips. An elastic member is provided in the platform to balance out slight differences of vertical movements between the respective bonding heads. When the lower end of the bonding head contacts an upper surface of the LSI chip in response to a descending movement of the platform, certain pressing force is applied to the LSI chips by the respective bonding heads. The number and/or the size of such bonding heads may be determined depending on the size of the LSI chips and/or an interval between the LSI chips.

SUMMARY

According to an embodiment of the invention, a compression-bonding apparatus includes a support stage and a pressing tool. The pressing tool includes a pressing stage, an elastic member and a plurality of bonding heads. The elastic member is held by the pressing stage. The plurality of bonding heads includes an upper surface attached to the elastic member and a lower surface facing an upper surface of the support stage.

It is to be understood that both the foregoing general description and the following detailed description are exemplary and explanatory, and are not restrictive of the invention, as claimed.

BRIEF DESCRIPTION OF DRAWINGS

The above-described and other features of the invention will become apparent from the following description of the embodiments in conjunction with the accompanying drawings, wherein.

DESCRIPTION OF EMBODIMENTS

Hereinafter, various embodiments of the present invention will be described with reference to the attached drawings.

Figure 1:
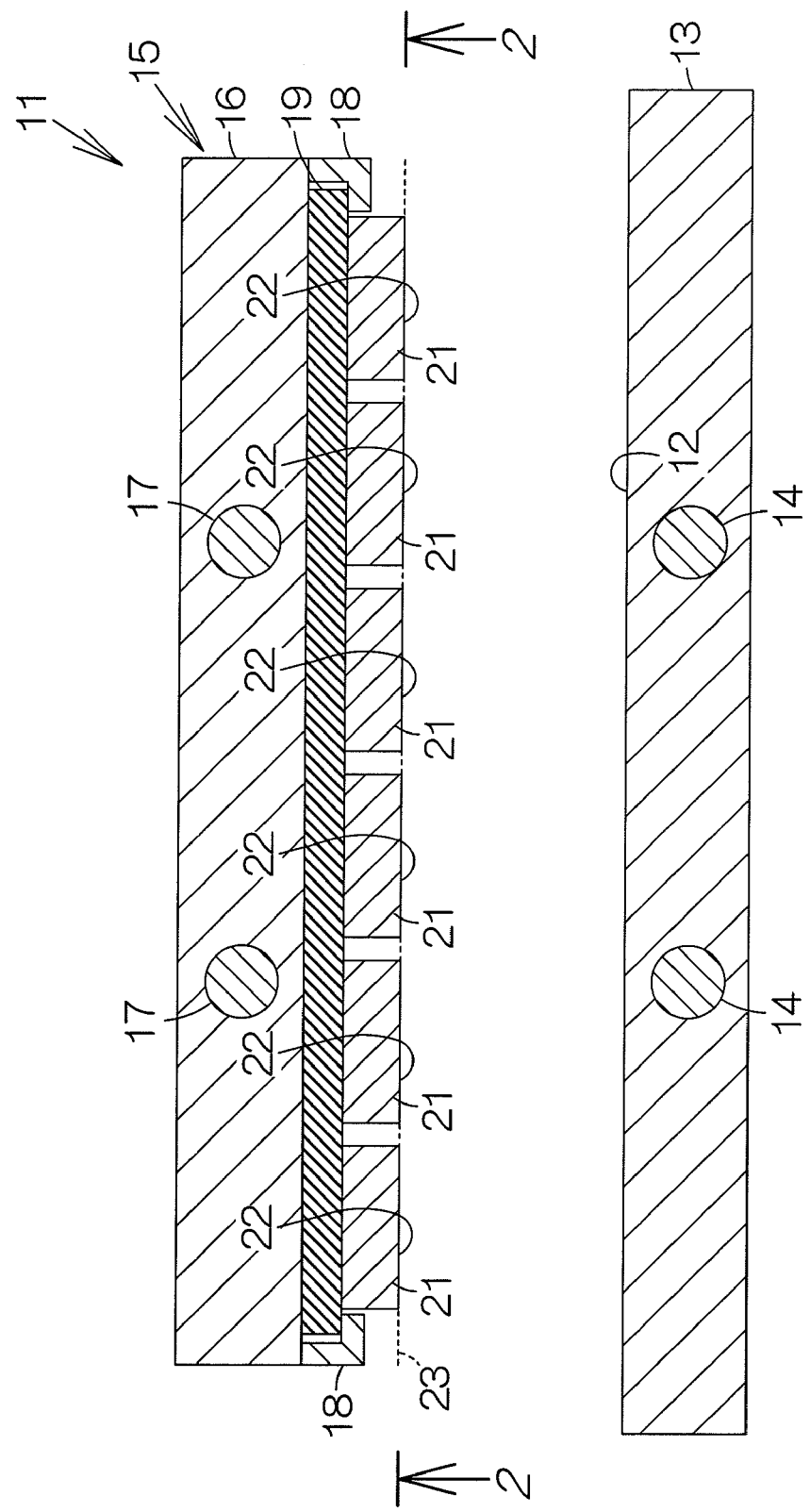
FIG. 1 illustrates a cross-sectional view that schematically depicts a compression-bonding apparatus according to a first embodiment of the present invention.

FIG. 1 schematically illustrates a compression-bonding apparatus 11 according to a first embodiment of the present invention. The compression-bonding apparatus 11 includes a support stage 13 and a pressing tool 15. The support stage 13 has a flat surface 12 provided thereon. The flat surface 12 of the support stage 13 may be horizontal. The support stage 13 may be formed of a rigid metal material having high heat conductivity. Also, a heater or heaters 14 may be embedded in the support stage 13. The heater 14 may have a straight and tubular shape. The heater 14 may extend parallel to the flat surface 12. An operation of the heater 14 heats the support stage 13.

The pressing tool 15 includes a pressing stage 16, an elastic member 19 and a plurality of bonding heads 21. The pressing stage 16 may be formed of a rigid metal material having high heat conductivity. The pressing stage 16 may move upward and downward in a vertical direction with respect to the flat surface 12 of the support stage 13. Similar to the support stage 13, a heater or heaters 17 may be embedded in the pressing stage 16. The heater 17 may have a straight and tubular shape. The heater 17 may extend parallel to a lower surface of the pressing stage 16. An operation of the heater 17 heats the pressing stage 16. The lower surface of the pressing stage 16 may be flat, the flat lower surface being parallel to the flat surface 12 of the support stage 13.

The elastic member 19 is provided on the lower surface of the pressing stage 16. At least two opposite ends of the elastic member 19 in the width direction may be supported by flanges 18. The flanges 18 may project downward from a periphery of the lower surface of the pressing stage 16. The elastic member 19 may have a flat rectangular shape with a predetermined thickness. The flanges 18 may extend along at least two opposite side edges of the elastic member 19. The opposite side edges of the elastic member 19 may be parallel to each other. A tip of each of the flanges 18 holds a periphery of a lower surface of the elastic member 19. A flat upper surface of the elastic member 19 is in close contact with the lower surface of the pressing stage 16. The elastic member 19 may be formed of rubber having heat resistance, such as silicone rubber or fluorine rubber. The overall lower surface of the elastic member 19 which has been installed in the described manner can be visually inspected from a position below the pressing tool 15. Thus, any deterioration of the elastic member 19, such as deformation and/or cracks, can be visually inspected with ease; therefore, a defective elastic member 19 can be timely exchanged.

A plurality of bonding heads 21 is provided on the lower surface of the elastic member 19. The bonding heads 21 may be formed of ceramics or metal such as stainless steel. Each bonding head 21 may have a flat rectangular shape with a certain thickness. The bonding heads 21 may be fixed to the lower surface of the elastic member 19 by heating under pressure or chemical bonding as described below. Specifically, an upper surface of the bonding head 21 is attached to the lower surface of the elastic member 19 made of rubber by deposition with heating under pressure. Alternatively, a chemical bonding may be used for the attachment based on the use of, for example, a solution containing Triazine-thiol.

Figure 2:
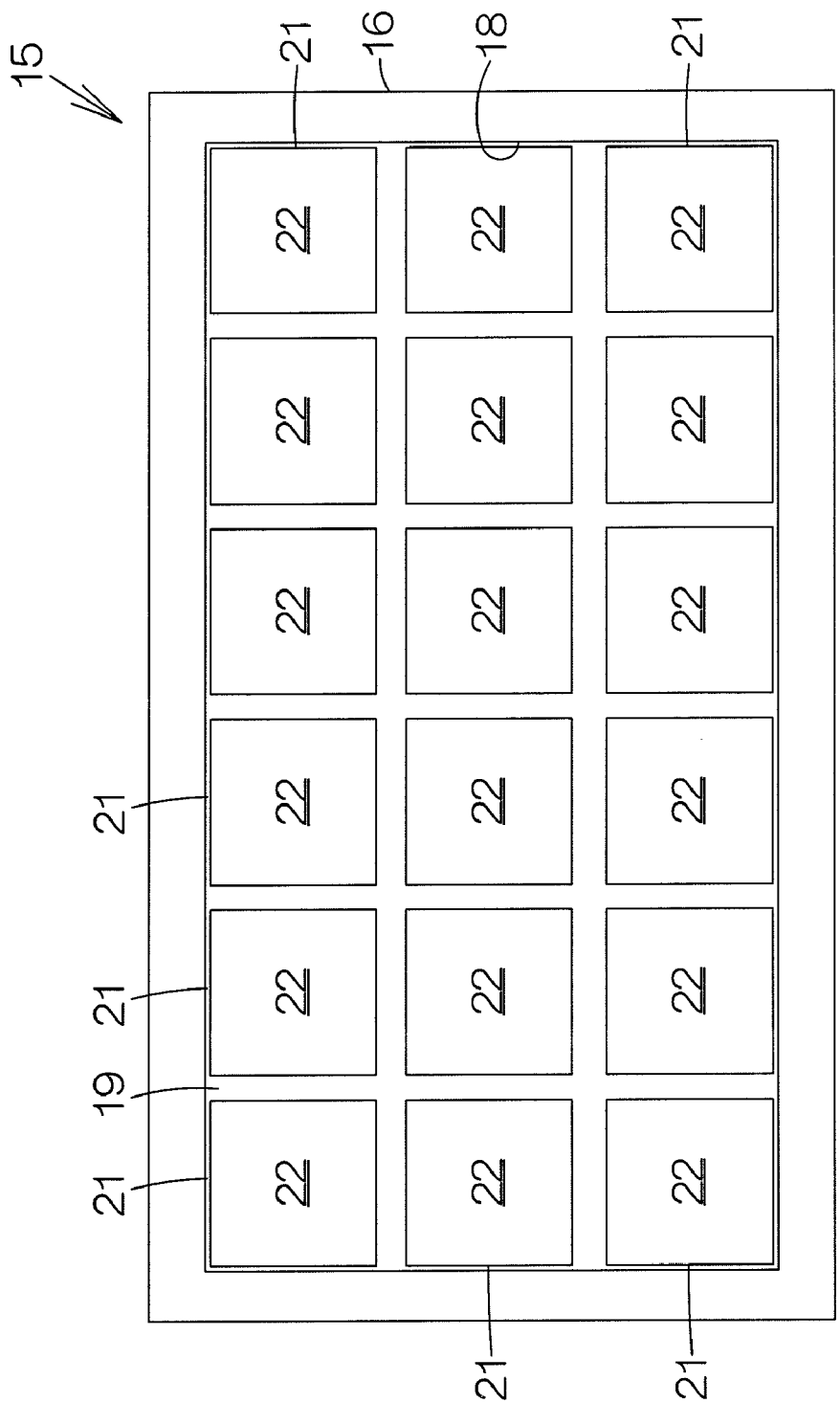
FIG. 2 illustrates a lower surface of a pressing tool taken along a section line 2-2 in FIG. 1.

A lower surface of each bonding heads 21 is flat and defines a contact surface 22 having the shape of a square. The shape of the contact surface 22 is not limited to a square, but may be round, rectangular or polygonal. The respective contact surfaces 22 are arranged on an identical plane 23. The plane 23 is defined as parallel to the upper surface 12 of the supporting stage 13. An area of the contact surface 22 may be designed depending on an area of an upper surface of a LSI chip to be mounted. The respective bonding heads 21 may be arranged at a certain interval, for example, in three rows and six columns, as in a grid pattern as illustrated in FIG. 2. The interval between adjacent bonding heads 21 may be designed to be uniform, taking into consideration an interval between adjacent semiconductor chips.

Figure 3:
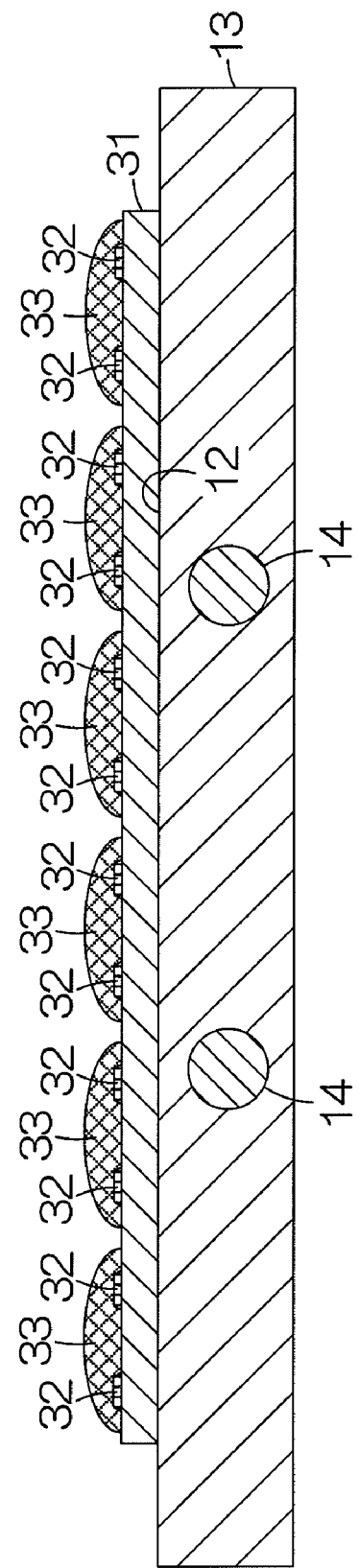
FIG. 3 illustrates a partial cross-sectional view of a compression-bonding apparatus relating to the mounting of a plurality of electronic components on a bulk circuit board according to the first embodiment.

Hereinafter, the mounting process of a plurality of LSI chips 34 according to a flip-chip bonding is described. As illustrated in FIG. 3, a bulk circuit board 31 is provided on the upper surface 12 of the support stage 13. A plurality of contact pads 32 are provided on the circuit board 31. The number of the contact pads 32 corresponds to that of the LSI chips 34 in the manner described below. The contact pads 32 are formed of a conductive material such as copper. A gold and/or nickel plating film may be formed on a surface of each contact pad 32. On the circuit board 31, an underfill material 33 of electrically-insulating adhesive is applied to corresponding areas where the LSI chips 34 are to be mounted. As the underfill material 33, thermosetting resin may be employed.

Figure 4:
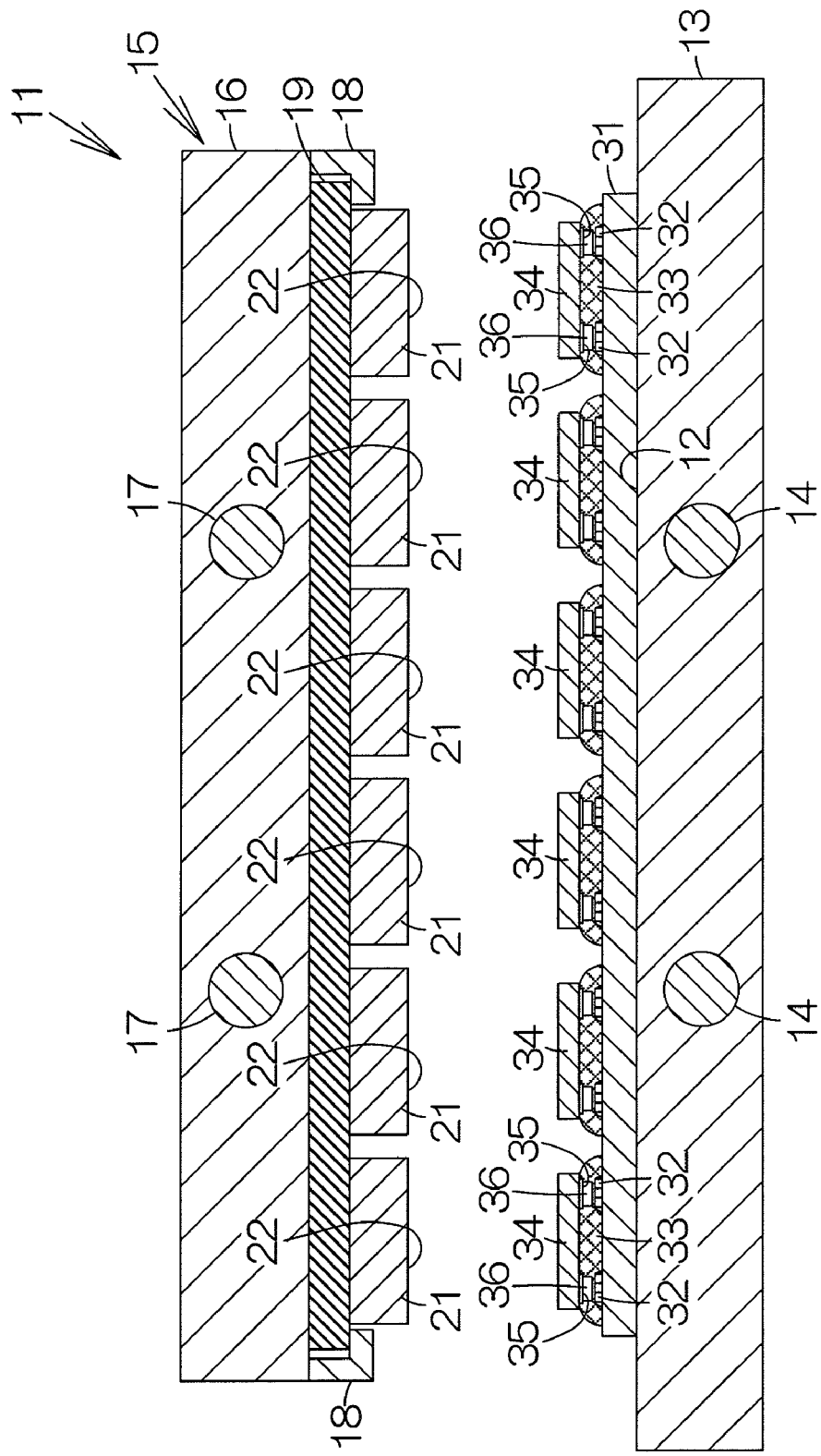
FIG. 4 illustrates a cross-sectional view of a compression-bonding apparatus relating to the mounting of a plurality of electronic components on a bulk circuit board according to the first embodiment.

Next, as illustrated in FIG. 4, each LSI chip 34 is disposed on the circuit board 31. Specifically, each LSI chip 34 includes contact pads 35 and conductive bumps 36 at a bottom surface thereof. The contact pads 35 may be formed of a conductive material such as copper. The conductive bumps 36 are deposited on the contact pads 35, and may be formed of a conductive material such as gold or solder. The contact pads 35 of the LSI chip 34 are aligned with matching pads 32 on the circuit board 31 so that the conductive bumps 36 are in contact with the matching pads 32. Subsequently, a space between the bottom surface of the LSI chip 34 and the underlying mounted components is filled with the thermosetting resin.

Figure 5:
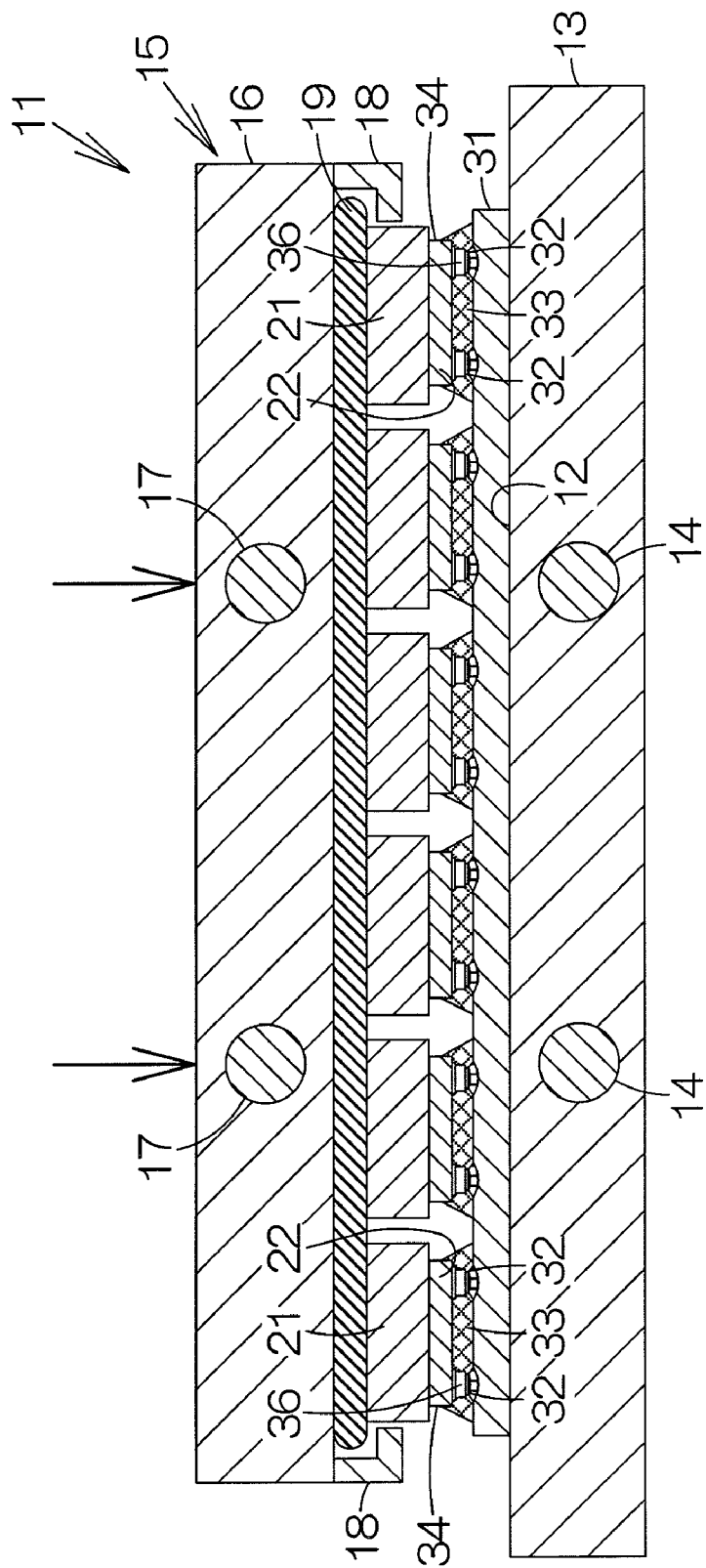
FIG. 5 illustrates a cross-sectional view of a compression-bonding apparatus relating to the mounting of a plurality of electronic components on a bulk circuit board according to the first embodiment.

Thereafter, the pressing tool 15 is positioned at a certain position above the circuit board 31. The pressing tool 15 descends toward the support stage 13. The descending movement of the pressing tool 15 is stopped at a certain height from the flat surface 12. As illustrated in FIG. 5, the top surface of the LSI chip 34 comes in contact with the contact surface 22 of the bonding head 21. In the first embodiment, the bonding heads 21 are aligned with matching LSI chips 34, which makes a one-to-one alignment. The size of the contact surface 22 is defined to be slightly larger than the size of the top surface of a LSI chip 34; thus, the entire top surface of each LSI chip 34 may come into contacted with the matching contact surface 22 of the bonding head 21. In response to a further descending movement of the pressing tool 15, the top surface of the LSI chip 34 is pressed by the bonding head 21 toward the circuit board 31.

In the process of compression-bonding, the conductive bumps 36 of the LSI chip 34 are pressed against the contact pads 32. In response to the pressure from the conductive bump 36, the contact pads 32 are forced toward the circuit board 31, and thus may be deformed. On the other hand, the bonding head 21 receives a force of counteraction toward the elastic member 19 in response to the pressure applied against the contact pads 32. In response to the counteraction force of the bonding head 21, the elastic member 19 is deformed because of its elastic characteristic. The elastic member 19 is deformed between a lower surface of the pressing stage 16 and an upper surface of each of the bonding heads 21. The elastic deformation of the elastic member 19 may reduce the variations in height of each LSI chip 34 measured from an upper surface of the circuit board 31. Consequently, the pressing tool 15 may mount the respective LSI chips 34 on the circuit board 31 with an equal force despite the variations in height of each LSI chip 34 from the circuit board 31.

Simultaneously, the heaters 14 and 17 operate. The heat from the heater 14 is transferred to the underfill materials 33 through the circuit board 31. Also, the heat from the heater 17 is transferred to the bonding heads 21 through the elastic member 19. Furthermore, the heat is transferred to the LSI chips 34 from the bonding heads 21, and finally transferred to the underfill materials 33. As a result, a temperature of the underfill materials 33 increases, and the underfill materials 33 are cured under a state where the conductive bumps 36 are in contact with the contact pads 32. In this way, the underfill materials 33 cause the LSI chips 34 to be fixed on the surface of the circuit board 31, and the mounting process of the LSI chips 34 is completed. On the other hand, the pressing tool 15 is controlled to ascend in the vertical direction with respect to the flat surface 12 of the supporting stage 13. Thereafter, the bulk circuit board 31 is cut into separate package substrates according to the desired size of the LSI chip packages. Finally, the manufacturing process of each LSI chip package is finished.

Figure 6:
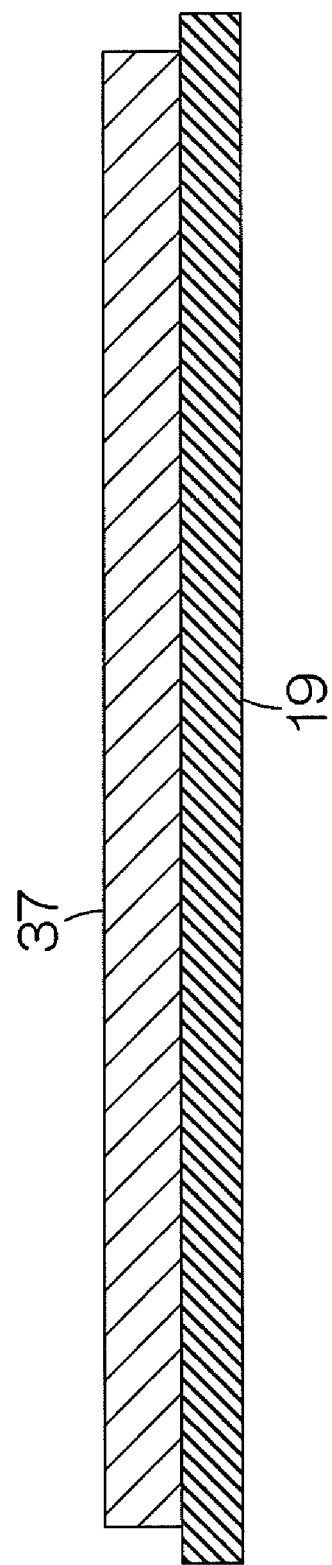
FIG. 6 illustrates a process of attaching a rigid plate to an elastic member according to the first embodiment.
Figure 7:
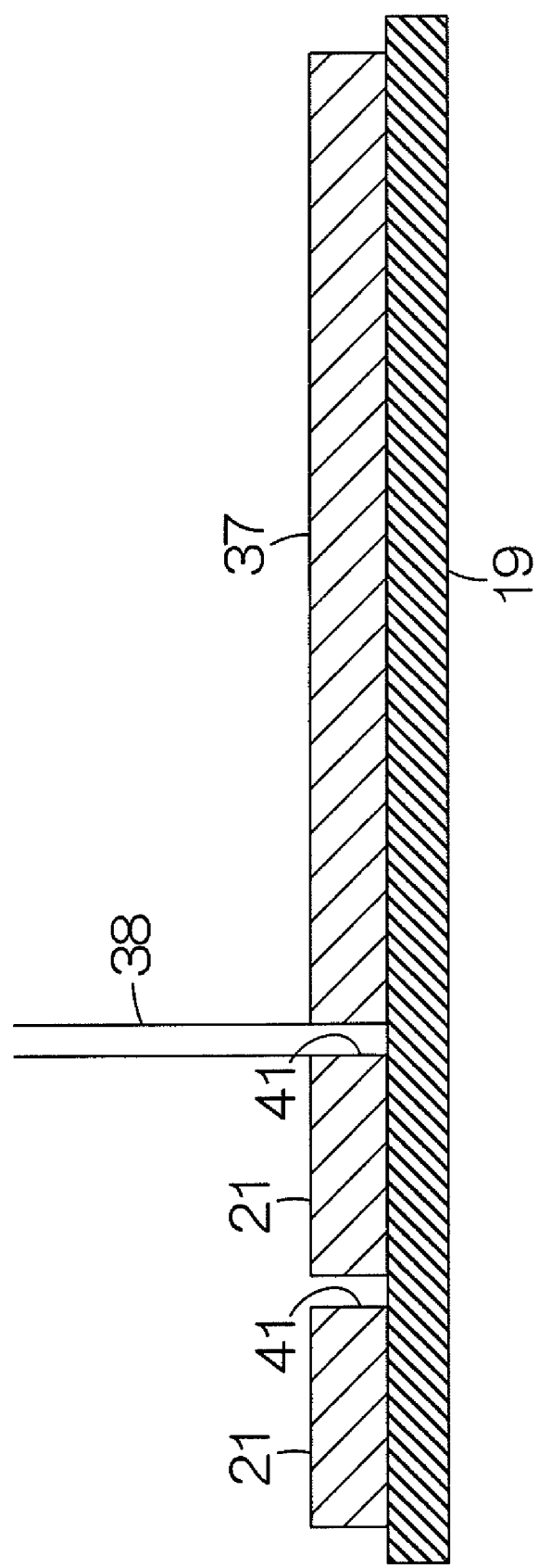
FIG. 7 illustrates a process of forming a plurality of cuts on the rigid plate of FIG. 6.

Next, a method of manufacturing the pressing tool 15 will be disclosed. As illustrated in FIG. 6, a rigid plate 37 is attached to one surface of the elastic member 19. The plate 37 is formed of ceramics or metal such as stainless steel. Next, as illustrated in FIG. 7, cuts 41 are formed on the plate 37 in a grid pattern; thus, the plate 37 is cut into separate pieces by, for example, a dicing blade 38. Alternatively, a laser beam machining may be employed instead of the dicing blade 38. A plurality of bonding heads 21 may be easily created from a single plate 37. An interval between the adjacent bonding heads 21 and/or an area of the respective contact surfaces 22 of the bonding heads 21 may be controlled by the width and/or the number of cuts 41. Thus, bonding heads 21 corresponding to a variety of semiconductor chips 34 may be produced with ease.

Figure 8:
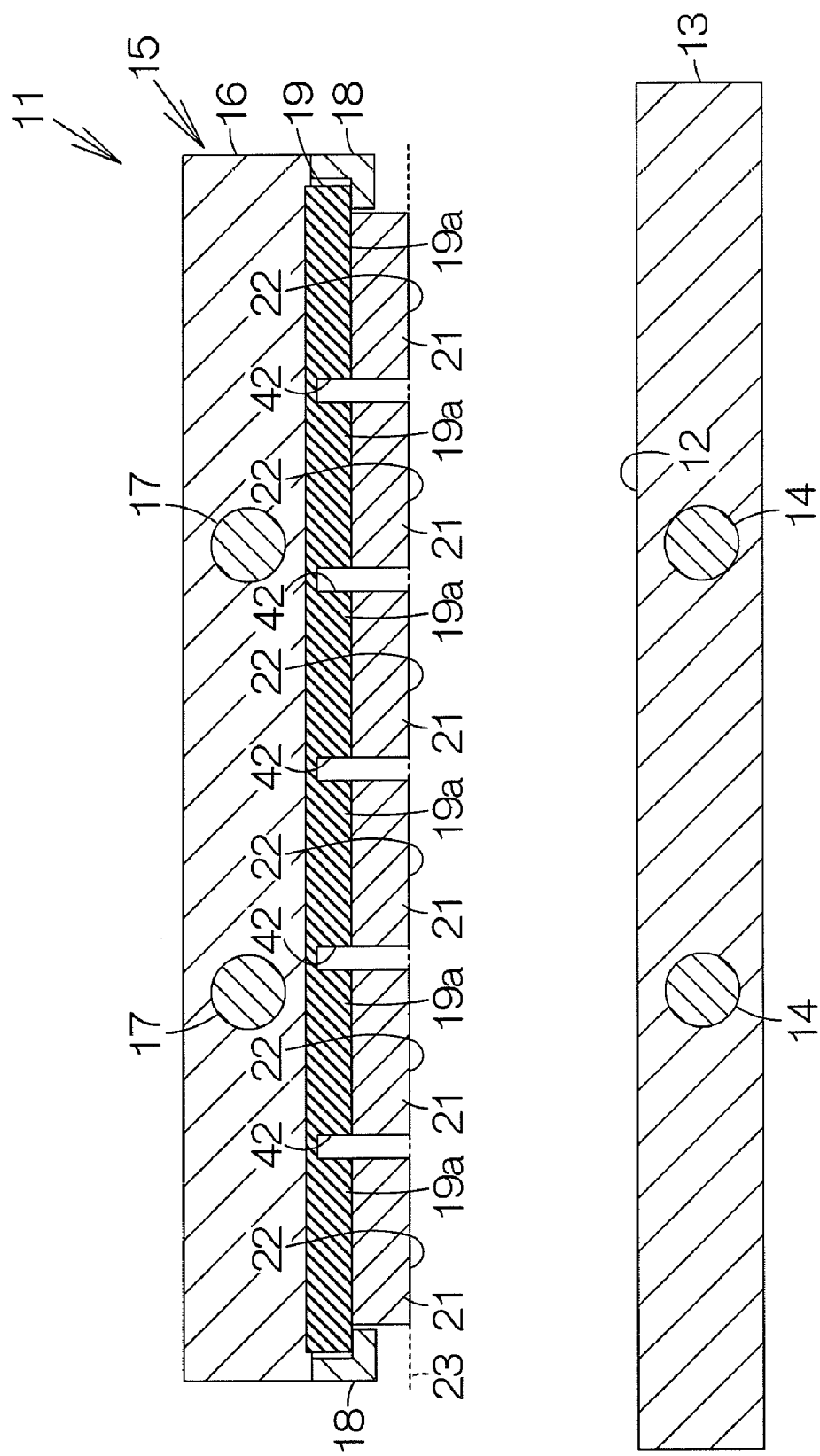
FIG. 8 illustrates a modified example of the compression-bonding apparatus according to the first embodiment of the present invention.

As a modified example of the first embodiment, cuts 41 on the plate 37 may be extended to the elastic member 19, which causes grooves 42 to be formed on the elastic member 19, as illustrated in FIG. 8. The grooves 42 may be formed with a dicing blade 38 or by laser beam machining. The grooves 42 are easily formed on the elastic member 19 within a sequence of cuts-forming process on the plate 37. A single elastic member 19 is segmented into multiple elastic pieces 19a based on the grooves 42. The respective elastic pieces 19a are matched with the respective bonding heads 21. By the grooves 42, the respective elastic pieces 19a are separately allowed to reduce the variations in height of each LSI chips 34 as measured from an upper surface of the circuit board 31.

Figure 9:
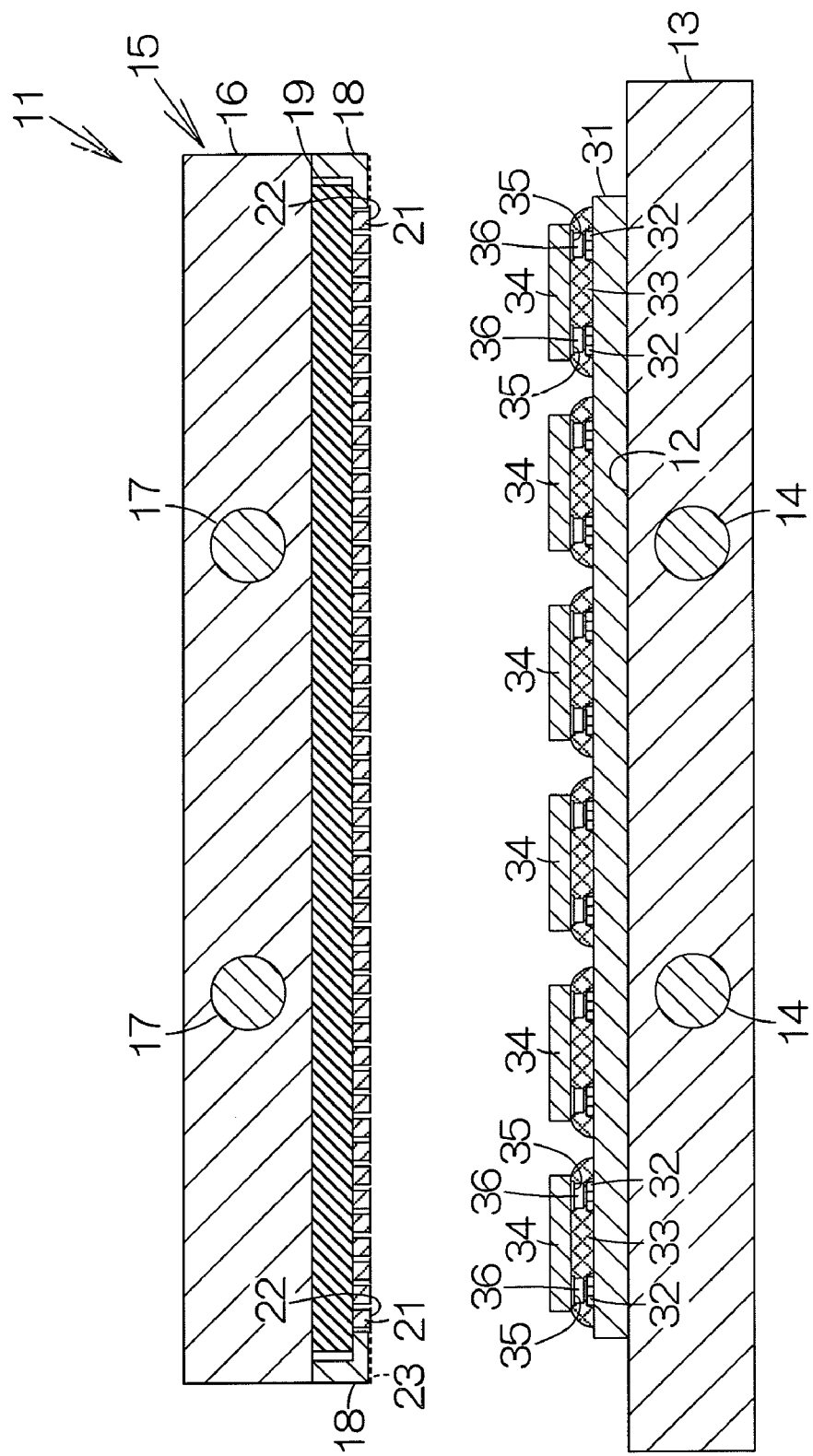
FIG. 9 illustrates another modified example of the compression-bonding apparatus according to the first embodiment.
Figure 10:
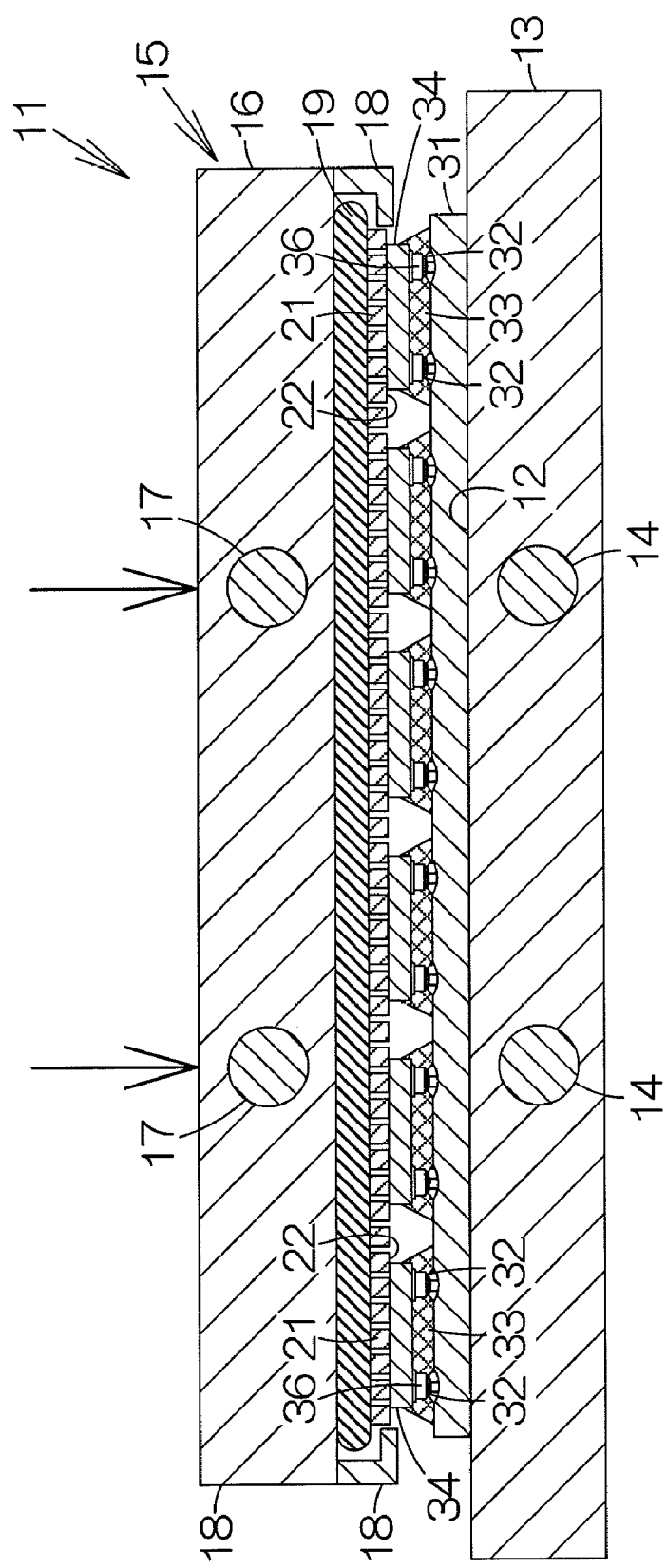
FIG. 10 illustrates a process of mounting a plurality of electronic components according to the modified example of FIG. 9.

FIG. 9 illustrates another modified example of the first embodiment. A plurality of bonding heads 21 having a smaller size than in the first embodiment is formed, in which the plurality of bonding heads 21 may interact with a single LSI chip 34. For example, as illustrated in FIG. 10, forty nine bonding heads 21 of 7 rows by 7 columns may be aligned with respect to the upper surface of each LSI chip 34. Thus, the plurality of bonding heads 21 may be pressed against a single LSI chip 34 toward the support stage 13. Consequently, even if LSI chips 34 having different sizes are placed on the circuit board or the upper surfaces of the LSI chips 34 vary in sizes thereof, the plurality of bonding heads 21 may reliably interact with the upper surface of each LSI chip 34. Thus, the pressing tool 15 according to the modified example may be applied to the flip-chip bonding process with respect to various kinds of LSI chips 34. Furthermore, the above-described grooves 42 may be formed on the lower surface of the elastic member 19.

Figure 11:
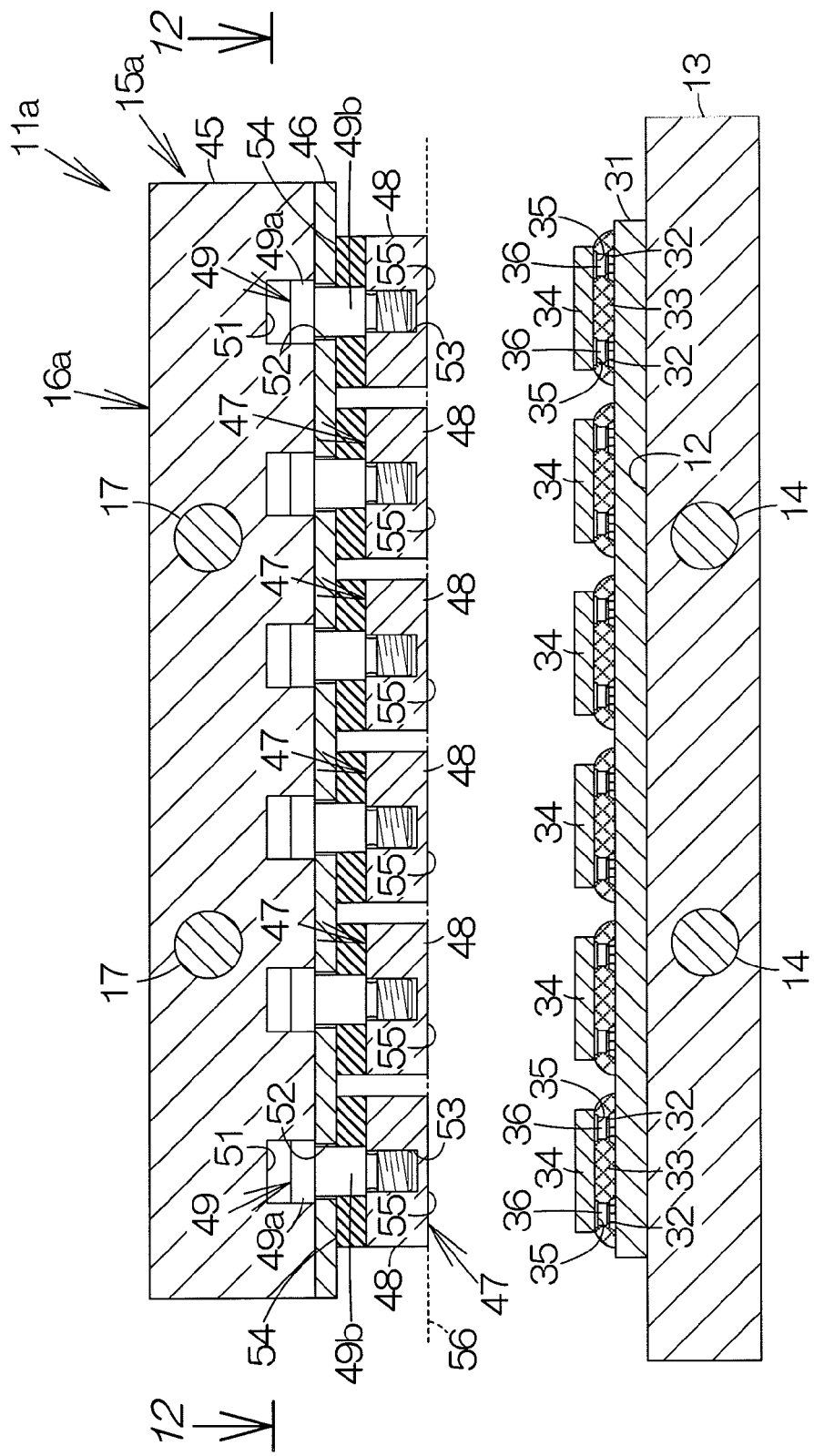
FIG. 11 illustrates a cross-sectional view that schematically depicts a compression-bonding apparatus according to a second embodiment of the present invention.

FIG. 11 illustrates a second embodiment of a compression-bonding apparatus 11a. In the second embodiment of the present invention, the same numerical references may be given to the same or similar structures in accordance with the first embodiment of the compression-bonding apparatus 11. A pressing stage 16a includes a stage body 45 having a rectangular shape with a predetermined thickness, and a base plate 46 provided on a lower surface of the stage body 45. The stage body 45 and the base plate 46 are formed, for example, of a rigid metal material having a high heat transfer characteristic. One or more heaters 17 are embedded in the stage body 45. A plurality of bonding heads 47 are held downward by the stage body 45 of the pressing stage 16a through the base plate 46. For example, each bonding head 47 includes a head body 48 having a rectangular shape with a certain thickness, and a bolt member 49. The head body 48 may be formed of an identical material with the bonding heads 21 according to the first embodiment as described above. An interval between the adjacent head bodies 48 may be set in accordance with an interval between the adjacent LSI chips 34, these two intervals being equal in dimension.

Figure 12:
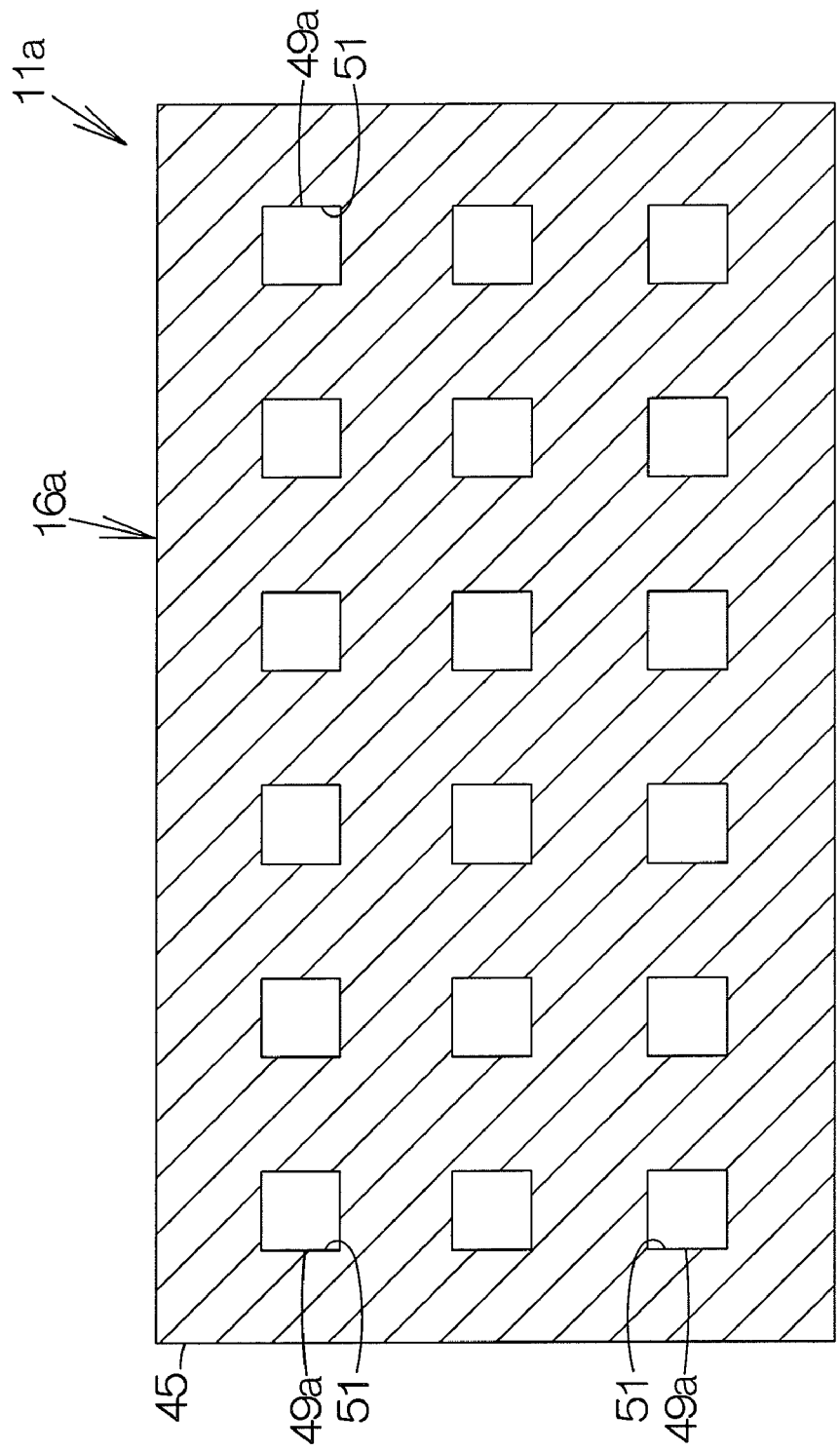
FIG. 12 illustrates a sectional view of the compression-bonding apparatus of FIG. 11 taken along a line 12-12 in FIG. 11.

The two ends of the bolt member 49 are respectively coupled to the stage body 45 and the head body 48. Specifically, the bolt member 49 includes a cap portion 49a and a shaft portion 49b. The cap portion 49a is positioned inside a depression 51 formed on the lower surface of the stage body 45. For example, the cap portion 49a and the depression 51 may have the same polygonal shape, such as a rectangular shape, as illustrated in FIG. 12. The rectangular shape of the cap portion 49a may limit the rotation of the shaft portion 49b. A through-hole 52 having a smaller width than the cap portion 49a is formed on the base plate 46. The shaft portion 49b is passed through the through-hole 52. Because the cap portion 49a of the bolt member 49 has a greater width than the through-hole 52 of the base plate 46, the cap portion 49a is supported on an upper surface of the base plate 46 outside the through-hole 52, and may be prevented from dropping off from the pressing tool 15a. An end of the shaft portion 49b is screwed into a threaded screw hole 53 on the head body 48. A certain space is secured between the cap portion 49a and a bottom surface of the depression 51. Thus, a limited displacement of the bonding heads 47 in a vertical direction may be allowed within the space.

An elastic member 54 is interposed, around an outer circumference of the shaft portion 49b, between an upper surface of the head body 48 and the lower surface of the base plate 46 of the pressing stage 16a. The elastic member 54 may be formed of the same or similar material as the elastic member 19 according to the first embodiment. The thickness of each elastic member 54 may be uniformly designed. An interval between the adjacent elastic members 54 may be designed such that the adjacent elastic members 54 do not interfere with each other even if both of the adjacent elastic members 54 are maximally deformed based on the displacement of corresponding head bodies 48 in the vertical direction. The overall lower surface of the elastic member 54 can be visually inspected from a position below the pressing tool 15 by, for example, removing the corresponding head body 48 from the shaft portion 49b. Thus, any deterioration of the elastic member 54, such as deformation and/or cracks, can be visually inspected with ease; therefore, a defective elastic member 54 can be timely exchanged.

A contact surface 55 is defined on a flat lower surface of each head body 48. The contact surface 55 may have a rectangular shape. The respective contact surfaces 55 are arranged on an identical plane 56. The plane 56 is defined to be parallel to the upper surface 12 of the supporting stage 13. An area of the contact surface 55 may be designed depending on an area of an upper surface of corresponding LSI chip 34. The head bodies 48 are aligned with matching LSI chips 34, which makes a one-to-one alignment. The area of the contact surface 55 is defined to be slightly larger than the area of the top surface of the LSI chip 34; thus, the entire top surface of each LSI chip 34 contacts a matching contact surface 55 of the head body 48.

Figure 13:
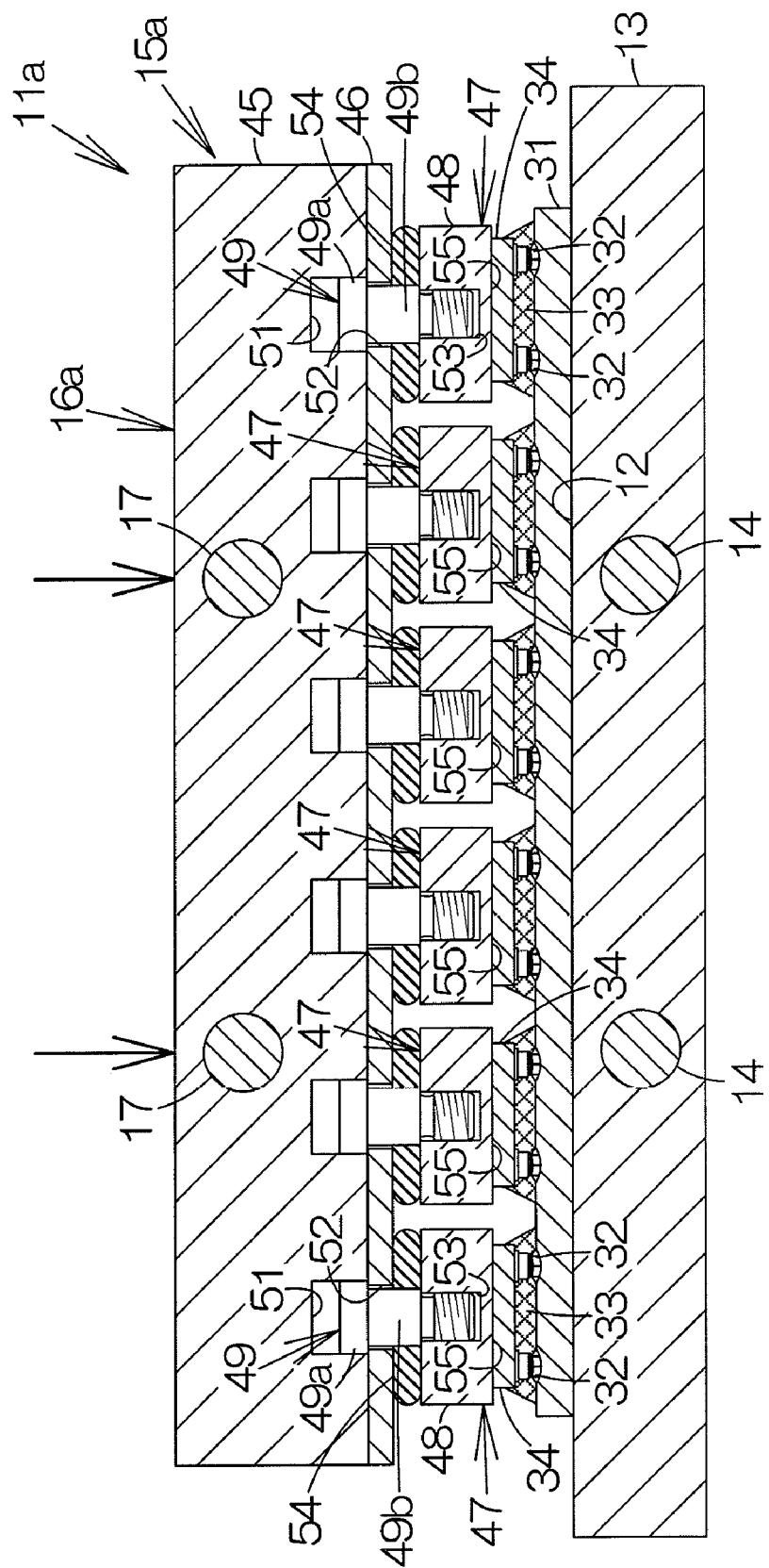
FIG. 13 illustrates a process of mounting a plurality of electronic components according to the second embodiment.

When the flip-chip bonding process is performed by the compression-bonding apparatus 11a, the upper surface of the LSI chip 34 is pressed by the contact surface 55 of the head body 48 in response to a descending movement of the pressing tool 15a, as illustrated in FIG. 13. The entire top surface of each LSI chip 34 may come into contact with the matching contact surface 55 of the head body 48. On the other hand, the head body 48 receives a force of counteraction toward the elastic member 54 based on a displacement of the bolt member 49 in response to the pressure applied against the LSI chip 32. The elastic member 54 is deformed between the base plate 46 and the head body 48. The contact pads 32 are pressed by matching conductive bumps 36 of the LSI chip 34. Thereafter, a curing process of the underfill material 33 is performed in a manner similar to that of the first embodiment, and the mounting process of the LSI chips 34 is completed.

Figure 14:
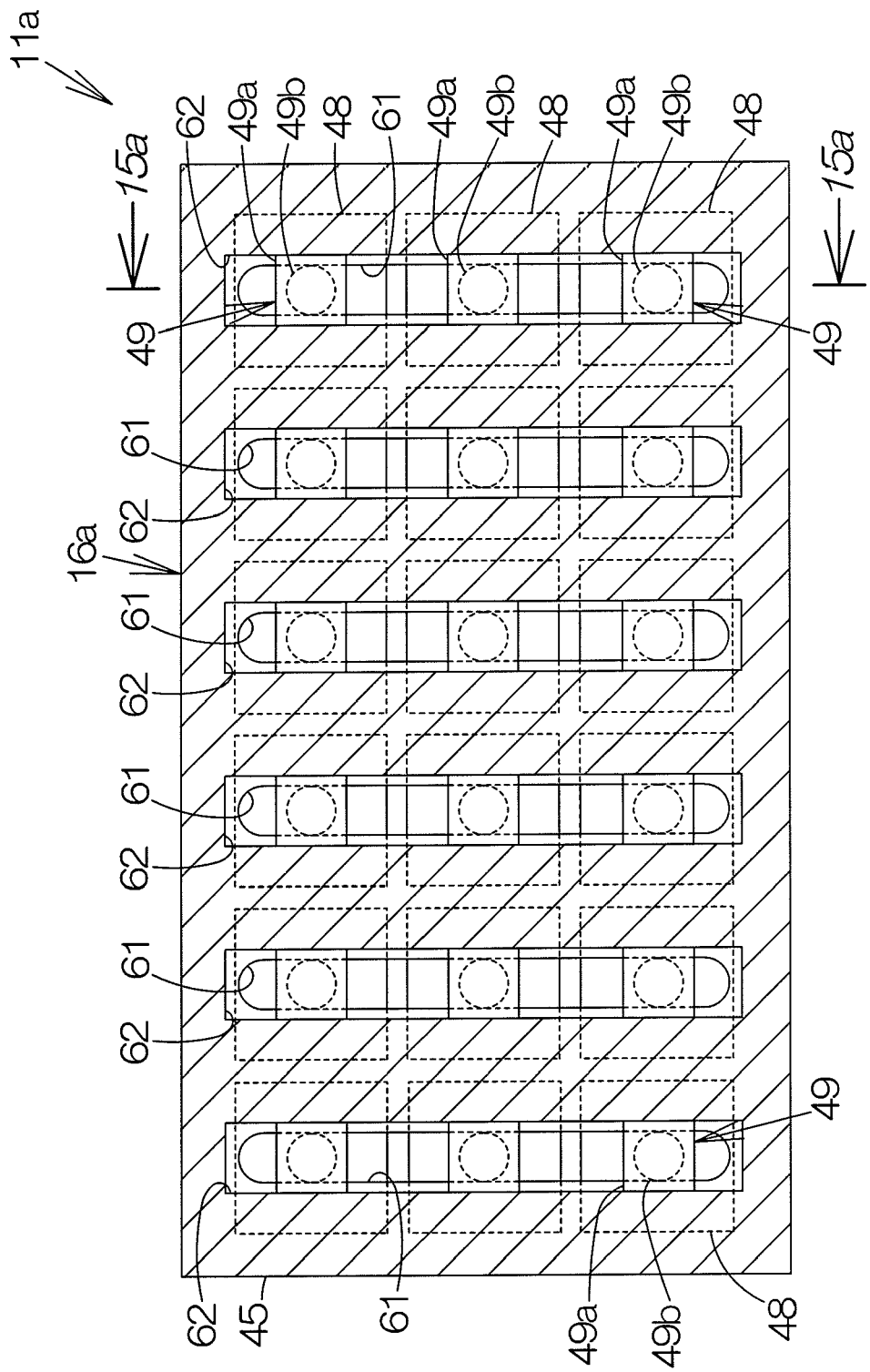
FIG. 14 illustrates a modified example of the second embodiment.
Figure 15:
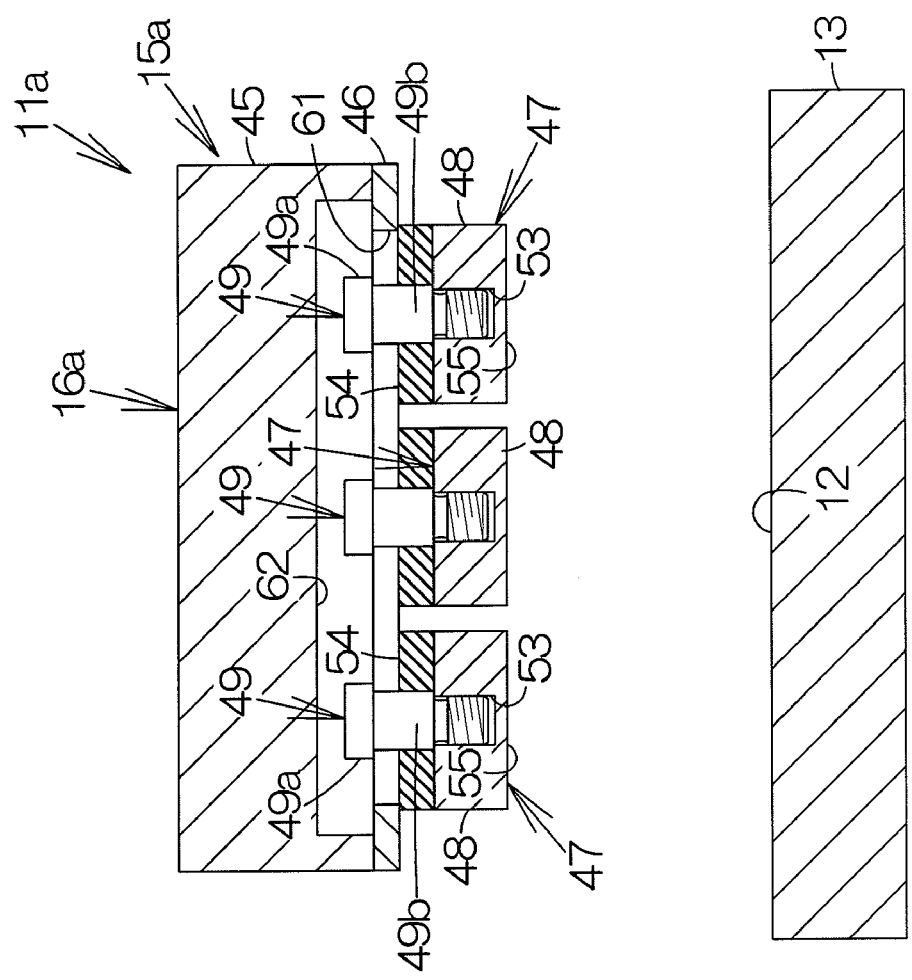
FIG. 15 illustrates another modified example of the second embodiment depicting a sectional view taken along a line 15-15 in FIG. 14.

FIG. 14 illustrates a modified example of the second embodiment. A plurality of longitudinal guide slits 61, instead of the through-holes 52, may be formed on the base plate 46 of the compression-bonding apparatus 11a. The guide slits 61 guide the motions of the bonding heads 47, for example, in a column direction. The guide slits 61 extend, respectively, in parallel. The shaft portion 49b of the bold member 49 is passed through the guide slit 61. In the modified example, three bonding heads 47 are arranged within one guide slit 61. On the other hand, a long groove 62 may be formed on the lower surface of the stage body 45 as illustrated in FIG. 15. The long groove 62 allows motions of the cap portion 49a of the bolt member 49. The same numerical references are given to the structures which are the same or similar to the structures found in the first embodiment of the compression-bonding apparatus 11a.

In response to the motions of the bonding heads 47 in a column direction, an interval between adjacent bonding heads 47 in the column direction, that is, an interval between adjacent head bodies 48 varies. Such a variation in interval may be adjusted depending on an interval between adjacent LSI chips 34. Consequently, according to the modified example of the second embodiment, the compression-bonding apparatus 11a may be used even if the intervals between the adjacent LSI chips 34 are not uniform. By loosening the corresponding bolt member 49 from the matching head body 48 to move the bonding head 47, a specific gap may be secured between the elastic member 54 and the base plate 46.

All examples and conditional language provided herein are intended for the pedagogical objects to aid the reader in understanding the invention and the concepts contributed by the inventors to further the art, and are to be construed as being without limitation to such specifically recited examples and conditions, nor does the organization of such examples in the specification relate to a showing of the superiority and inferiority of the invention. Although the embodiments of the invention have been described in detail, it will be understood by those of ordinary skill in the relevant art that various changes, substitutions, and alterations could be made hereto without departing from the spirit and scope of the invention as set forth in the claims.

What is claimed is:

1. A compression-bonding apparatus, comprising:
   a support stage; and
   a pressing tool including a pressing stage, an elastic member held by the pressing stage and a plurality of bonding heads, each of the bonding heads including a screw hole,
   wherein the pressing stage includes a plurality of depressions, each of the depressions is provided in accordance with each of the bonding heads,
   wherein the pressing stage includes a plurality of bolt members, a cap portion of each bolt member being positioned in the depression, a shaft portion of each bolt member being positioned in the screw hole, a space is provided between the cap portion and a bottom surface of the depression,
   wherein each of the bonding heads includes an upper surface attached to the elastic member and a lower surface facing an upper surface of the support stage.

2. The compression-bonding apparatus according to claim 1, wherein each lower surface of the bonding heads is arranged on an identical plane.

3. The compression-bonding apparatus according to claim 1, wherein the elastic member includes a groove on a surface at a location corresponding to an interval between adjacent bonding heads.

4. The compression-bonding apparatus according to claim 1, further comprising a first heater embedded in the support stage.

5. The compression-bonding apparatus according to claim 1, further comprising a second heater embedded in the pressing stage of the pressing tool.

6. The compression-bonding apparatus according to claim 1, wherein an area of each lower surface of said plurality of bonding heads is greater than that of an upper surface of corresponding electronic component.

7. The compression-bonding apparatus according to claim 1, wherein said plurality of bonding heads are deposited on the elastic member.

8. The compression-bonding apparatus according to claim 1, wherein said plurality of bonding heads are chemically bonded to the elastic member.

9. The compression-bonding apparatus according to claim 1, wherein the pressing stage includes at least a pair of flanges projecting downward from a periphery of the pressing stage.

10. The compression-bonding apparatus according to claim 9, wherein a periphery of the elastic member is held by the flanges of the pressing stage.

* * * * *